United States Patent [19]

Tsu

[11] Patent Number: 5,216,262
[45] Date of Patent: Jun. 1, 1993

[54] QUANTUM WELL STRUCTURES USEFUL FOR SEMICONDUCTOR DEVICES

[76] Inventor: Raphael Tsu, 9327 Willowglen Tr., Charlotte, N.C. 28215

[21] Appl. No.: 844,725

[22] Filed: Mar. 2, 1992

[51] Int. Cl.[5] .......................................... H01L 27/14
[52] U.S. Cl. ................................... 257/17; 257/21; 257/18; 257/20; 257/22; 257/24; 257/25; 257/411; 372/45
[58] Field of Search ............... 257/21, 17, 22, 15, 257/20, 18, 24, 290, 411, 25, 23; 372/45

[56] References Cited

U.S. PATENT DOCUMENTS

| | | | |
|---|---|---|---|
| 4,088,515 | 5/1978 | Blakeslee et al. | 257/22 XR |
| 4,205,329 | 5/1980 | Dingle et al. | 257/17 |
| 4,665,412 | 5/1987 | Ohkawa et al. | 257/17 |
| 4,860,297 | 8/1989 | Hayakawa et al. | 372/45 |
| 4,999,844 | 3/1991 | Imamoto | 372/45 |
| 5,051,786 | 9/1991 | Nicollian et al. | 357/4 |
| 5,068,867 | 11/1991 | Hasenberg et al. | 257/17 XR |

OTHER PUBLICATIONS

Capasso et al., "Quantum Functional Devices: Resonant-Tunneling Transistors, Circuits with Reduced Complexity, and Multiple-Valued Logic," *IEEE Transactions on Electron Device*, vol. 36, No. 10, Oct. 1989, pp. 2065-2081.
Sols, "On the Possibility of Transistor Action Based on Quantum Interference Phenomena," *Appl. Phys. Lett.*, 54(4), Jan. 23, 1989, pp. 350-52.
Ye et al., "Resonant Tunneling via Microcrystalline-Silicon Quantum Confinement," *Phys. Rev. B*, vol. 44, No. 4, Jul. 15, 1991, pp. 1806-11.
People, "Physics and Applications of $Ge_xSi_{1-x}$/Si Strained-Layer Heterostructures", *IEEE Jour. of Quantum Electronics*, vol. QE-22, No. 9, Sep. 1986, 1696-1710.
Deppe et al., "Room-Temperature Continuous Operation of P-N $AL_xGA_{1-x}As$-GaAs Quantum Well Heterostructure Lasers Grown on Si," *Appl. Phys. Lett.* 51(9), Aug. 31, 1987, pp. 637-39.
"Heterostructures Grown by Molecular Beam Hetero-Epitaxy on Si Substrates," *IEEE Journal of Quantum Electronics*, vol. QE-22, No. 9, Sep. 1986, pp. 1587-91.
Matthews et al., "Defects in Epitaxial Multilayers," *Journal of Crystal Growth*, 32 (1976), pp. 265-273.
Osbourn, "Strained-Layer Superlattices from Lattice Mismatched Materials," *J. Appl. Phys.* 53(3), Mar. 1982, pp. 1586-89.
Tsu et al., "Passivation of Defects in Polycrystalline Superlattices and Quantum Well Structures," *Appl. Phys. Lett.*, 55(18), Oct. 30, 1989, pp. 1897-99.
Tsu et al., "Superlattice and Negative Differential Conductivity in Semiconductors," *IBM Journal of Research and Development*, vol. 14, No. 1, Jan. 1970, pp. 61-65.
Tsu et al., "Tunneling in a Finite Superlattice," *Appl. Phys. Lett.*, vol. 22, No. 11, Jun. 1973, pp. 562-564.
Chang et al., "Resonant Tunneling in Semiconductor Double Barriers," *Applied Physics Letters*, vol. 24, No. 12, Jun. 15, 1974, pp. 593-595.
Van der Ziel et al., "Optically Pumped Laser Oscillation in the 1.6-1.8 $\mu$m Region from Strained Layer $Al_{0.4}Ga_{0.6}SB$/GaSB/GaSB/$Al_{0.4}Ga_{0.6}Sb$/Double".

*Primary Examiner*—William Mintel
*Attorney, Agent, or Firm*—Ladas & Parry

[57] ABSTRACT

A quantum well structure useful for semiconducting devices comprises two barrier regions and a thin epitaxially grown monocrystalline semiconductor material quantum well sandwiched between said barrier regions. Each barrier region consists essentially of alternate strain layers forming a superlattice, each of said layers being thinner than said quantum well. The layers are so thin that no defects are generated as a result of the release of stored strain energy.

17 Claims, 2 Drawing Sheets

QUANTUM WELL STRUCTURES USEFUL FOR SEMICONDUCTOR DEVICES

BACKGROUND OF THE INVENTION

1. Field of the Invention

The invention relates to quantum well structures for semiconducting devices, the structures including a strain-layer superlattice, and to devices employing the superlattice for various applications including for metal oxide-semiconductor field effect transistors.

2. Description of the Related Art

Prior publications concerning superlattices and quantum well structures are listed as follows, and the disclosure of each of said prior publications is incorporated herein by reference:

1. L. Esaki and R. Tsu, IBM J. Res. and Dev. 14, 61 (1970).
2. R. Tsu and L. Esaki, Appl. Phys. Lett. 22, 562(1973); L.L. Chang, L. Esaki and R. Tsu, ibid 24 593(1974).
3. J.P. van der Ziel et al., IEEE Q.E. 22 1587(1986).
4. J.W. Matthews and A.E. Blakeslee, J. Crystal. Growth 32 265(1976).
5. G.C. Osbourn, J. Appl. Phys. 53, 1586(1982).
6. E.H. Poindexter & P.J. Caplan, in "Ins. Films on Semi." (Springer, Berlin 1981) p. 150.
7. E.H Nicollian and R. Tsu, U.S. Pat. No. 5,051,786, Sep. 24, 1991; R. Tsu, E.H. Nicollian, and A. Reisman, Appl. Phys. Lett. 55, 1897(1989).
8. Q.Y.Ye, R. Tsu and E.H. Nicollian, Phys. Rev. B44, 1806(1991).
9. R. People, IEEE Q.E. 22, 1696(1986).
10. D.G. Deepe et al., Appl. Phys. Lett. 51, 637(1987).

For a general review of quantum devices, see F. Capasso et al. IEEE, Transactions on Electron Devices 36, 2065(1989) and F. Sols et al., Appl. Phys. Lett. 54 350(1989), the disclosure of each being incorporated herein by reference.

Electronic industries have entered into a new domain of small devices dictated by quantum mechanical effects. Whenever the electron mean free path exceeds the physical dimensions, the wave nature of the electrons play a dominant role in the operations of these devices such as the now-famous superlattice (see publication 1 above) and quantum well structures (see 2 above). All these new devices involve electrons confined in a quantum well between two energy barriers. To date, the wells and barriers in general, utilize a lattice matched system such as the GaAs/GaAlAs superlattices, or a strain-layer system such as AlGaSb/GaSb heterojunction lasers (see 3 above). As long as the thickness of the strain-layer system is kept below certain values determined by the stored strain energy in those layers, a defect-free superlattice is possible for lattice mismatched systems (see 4 and 5 above). Since the backbone of the electronic industry is in silicon technology, the involvement of silicon is required in order for quantum devices to play an important role. It is well known that the importance of the metal oxide-semiconductor field effect transistor (MOSFET) owes its success to the low interface defect density of the a-SiO$_2$ (amorphous SiO$_2$) and Si interface (see 6 above). The problem is that once an amorphous layer is grown, it is impossible to grow subsequent silicon epitaxially.

Therefore it is not possible to realize quantum devices with the Si/a-SiO$_2$ system, except where microcrystalline Si is involved (see 7 and 8 above). This invention involves the creation of alternate layers of SiO$_2$ and Si, as a strain-layer superlattice, serving as energy barriers for confinement. This is possible provided the layer thickness is no more than a couple of mono-atomic layers. Specifically, we propose a structure consisting of a quantum well formed by silicon with energy barriers formed by monolayers of SiO$_2$/Si strain-layer superlattice. This new scheme opens the door for a silicon based family of new quantum devices.

A superlattice consisting of Si and SiO$_2$ should be the ideal choice; however as SiO$_2$ grows thicker, strain due to the extremely high lattice mismatch dominates and resulting SiO$_2$ becomes amorphous, preventing the subsequent growth of epitaxial layers. Matthews and Blakeslee (4 above) showed that if the thickness of the strain layer is thin enough the stored energy, if released, is below the creation energy for defects such as dislocations, the strain layer is then PERFECT, and subsequent growth of the epitaxial layer can proceed. This idea is responsible for many injection lasers (see 10 above).

SUMMARY OF THE INVENTION

The invention provides a quantum well structure useful for semiconducting devices, said structure comprising two barrier regions and a thin epitaxially grown monocrystalline semiconductor material quantum well sandwiched between said barrier regions, each barrier region consisting essentially of alternate strain layers forming a superlattice, each of said layers being thinner than said quantum well and being so thin that no defects are generated as a result of the release of stored strain energy.

The invention further provides a metal oxide-semiconductor field effect transistor, comprising silicon having thereon a metal contact, the metal contact being separated from said silicon by an insulating layer, said insulating layer consisting essentially of alternate strain layers of SiO$_2$ and Si forming a superlattice, each of said layers being so thin that no defects are generated as a result of the release of stored strain energy.

Also provided in accordance with the invention is a barrier material for use in semiconductor devices including quantum well structures, said material consisting essentially of alternate strain layers of SiO$_2$ and Si forming a superlattice, each of said layers being so thin that no defects are generated as a result of release of stored strain energy.

According to a preferred embodiment of the invention there is provided a quantum well structure useful for semiconducting devices, said structure comprising two barrier regions and a thin epitaxially grown monocrystalline Si quantum well sandwiched between said barrier regions, each barrier region consisting essentially of alternate strain layers of SiO$_2$ and Si forming a superlattice, each of said layers being thinner than said quantum well and being so thin that no defects are generated as a result of the release of stored strain energy.

In another embodiment of the invention, there is provided a quantum well structure useful for semiconducting devices, said structure comprising two barrier regions and a thin monocrystalline quantum well sandwiched between said barrier regions, the quantum well consisting essentially of alternate strain layers forming a superlattice, each of said layers being so thin that no defects are generated as a result of stored strain energy, each barrier region being thinner than said quantum well and consisting of an epitaxially grown monocrystalline semiconductor material.

BRIEF DESCRIPTION OF THE DRAWINGS

FIG. 2b is a diagrammatical plane representation of a top view of the layers which are represented in FIG. 2a.

DESCRIPTION OF THE PREFERRED EMBODIMENTS

In preferred embodiments of the invention a quantum well consists of mono-crystalline silicon epitaxially grown between two barrier sections. The barrier section consists of a region of alternate layers each at generally one to four monoatomic layers thick. The alternating layers are $SiO_2$ and Si. This structure exhibits all of the quantum confinement effects and is fully compatible with silicon technology.

The energy barriers (layers with higher energy bandgap serving as a blocking layer for the passage or penetration of electrons) of the quantum devices each consists of a strain-layer superlattice of $(SiO_2/Si)n$.

Figure 1:
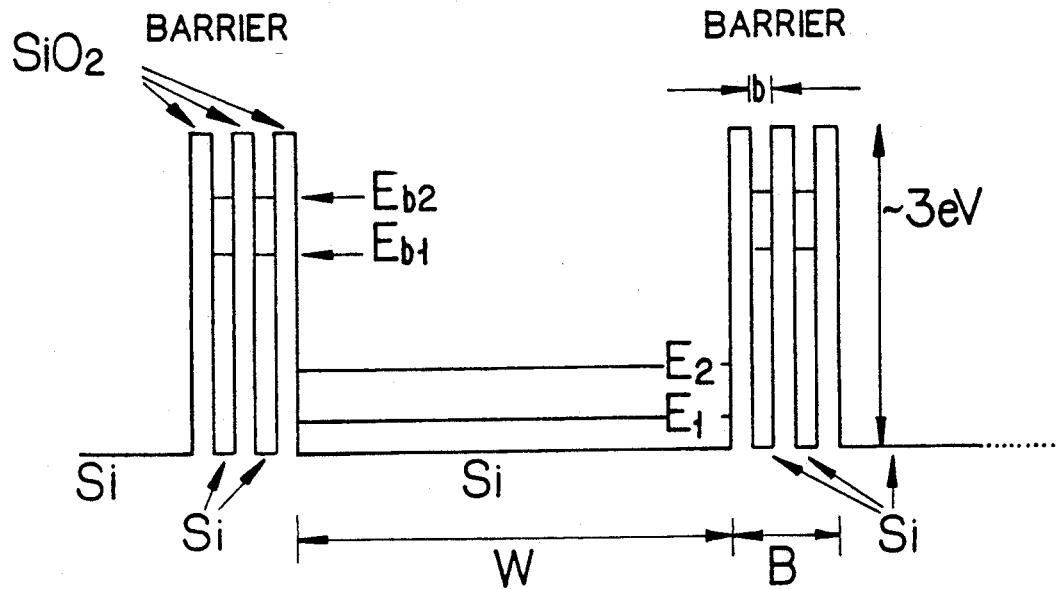
FIG. 1 is a schematic representation of a quantum well structure according to this invention.

While a couple of monolayers of $SiO_2$ on Si is not enough to serve as a barrier to silicon for quantum confinement, this invention proposes to build a region of alternating layers of $Si/SiO_2/Si/SiO_2$..., as a barrier for Si as shown in FIG. 1.

In FIG. 1, the silicon quantum wells with width W should have energies given by $$E_n = E_t + \left(\frac{h^2}{2m}\right)\left(\frac{n\pi}{w}\right)^2$$

and Si in-between $SiO_2$ has well width b, and should have energies $$E_{bn} = E_t + \left(\frac{h^2}{2m}\right)\left(\frac{n\pi}{b}\right)^2$$

If $b > W$, then $E_{b1} < E_n$, and the lower states in the quantum well $E_1$ and $E_2$ should be as distinct as any quantum well levels in III-V semiconductors. And since the thickness of $SiO_2$ is only a couple monolayers, the strain energy stored should be far below that which allows the generation of defects. The ideal quantum well with Si based technology is now possible!

Conventional epitaxial growth techniques such as VPE (vapor phase epitaxy) with the use of gaseous sources such as $SiH_4$, MBE (molecular beam epitaxy), and CBE (chemical beam epitaxy) may be used to fabricate such structures. The latter two methods are preferred since this offers better control of the process. Ultra high vacuum should be used to avoid contaminants.

In a preferred embodiment of the present invention, the quantum well structure for semiconducting devices comprises: first and second barrier regions each consisting of alternate layers of $SiO_2/Si$ with thicknesses so thin that no defects can be generated as a result of the release of the stored strain energy. This thickness is generally in the range of 2 to 4 monolayers. A much thicker section of pure silicon is sandwiched between these barrier regions serving as quantum confinement of carriers. Note that the proposed barriers can also serve to confine the holes in the valence band. Doping either with modulation doping, i.e. only in the silicon layers in the barrier region or involving also the well region may be incorporated to form desired junction characteristics. Hydrogen may also be used to passively reduce the residual defects if found necessary.

The following applications for the structure of the invention are listed:
(1) momentum selection rule breakdown for pseudodirect optical transition for optoelectronic applications such as light emitting diodes and lasers,
(2) resonant tunneling devices and high frequency oscillators and amplifiers for high speed switching,
(3) electric field modulation of excitons involving the transitions of the confined electrons and hole states,
(4) modulation doping for high transverse mobility as interconnections for VLSI.

This invention, utilizing a SL-superlattice as barrier confinement, may be extended to include cases where the thickness is too great for a regular SL-superlattice. For example, in a GaP/GaAs system, the thickness of GaAs exceeds the Matthew's criterion. In such a case, we can use alternate layers of (GaP/GaAs)n/GaP... as the barrier with GaAs free from the limitations imposed by the Matthew's criterion. In short, we can now include a superlattice where only the barriers consist of a SL-superlattice. Obviously, the reverse situation also applies where only the barriers are made of pure GaP with the wells made of SL-superlattices. However, since the confined electron will spend more time in the well, the reverse structure is generally less desirable except in the case of quantum step.

Figure 3:
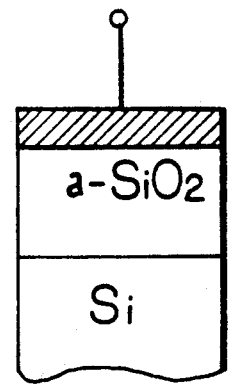
FIG. 3 is a schematic illustration of a conventional MOSFET.
Figures 4, 5:
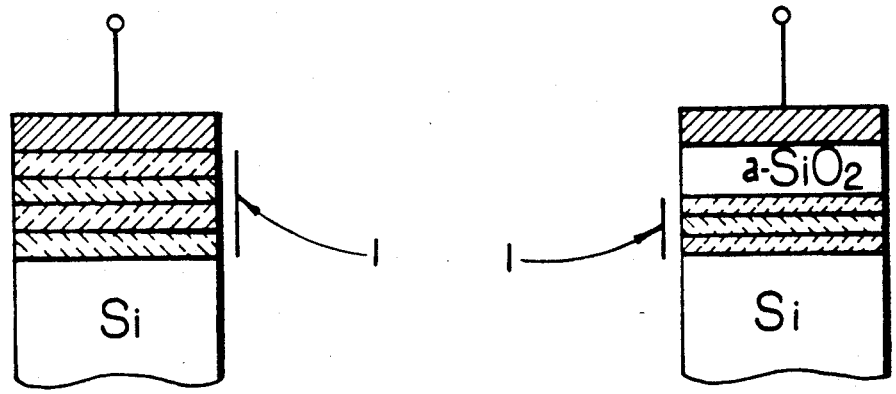
FIG. 4 is a schematic illustration of a metal-strain layer-superlattice field effect transistor (MSLSFET) of the present invention.
FIG. 5 is a schematic illustration of a metal oxide-strain layer-superlattice field effect transistor (MOSLSFET) of the present invention.

The silicon MOSFET (FIG. 3) is probably the most important solid state electronic device. The oxide, amorphous $SiO_2$ is sandwiched between a metal contact and silicon. The lower the interface defect density between the amorphous $SiO_2$ and silicon, the faster is the switching speed. The replacement of the amorphous $SiO_2$ by a strain-layer superlattice of $SiO_2/Si/SiO_2$ etc. described in this invention, can further reduce the interface density between the silicon and the insulator. To be more precise, as shown in FIG. 4, the amorphous $SiO_2$ serving as the insulating layer between the metal gate and the silicon is now replaced by this strain-layer superlattice 1 of $SiO_2/Si/SiO_2/Si$ etc. Alternatively, as shown in FIG. 5, if the oxide thickness is t, we can have a layer of t/2 next to the silicon consisting of the superlattice 1 of $SiO_2/Si/SiO_2...$, and the top t/2 consisting of the usual amorphous $SiO_2$. In this configuration, there will be defects at the interface between the amorphous $SiO_2$/strain-layer superlattice. But now these defects are located away from the silicon.

Therefore, the MSLSFET and MOSLSFET embodiments of the present invention represent a much improved MOSFET!

In the present invention each layer of the alternating layers of the superlattice normally has a thickness of 1 to 4 monolayers. In some cases there are design reasons, such as to lower gate conductance, to use a wider layer, which can be up to 20 alternate layers with each of thickness 1 to 4 monolayers.

The number of alternating layers of the superlattice thus is variable depending on design considerations, and this number normally is up to tens of layers, but in some cases could be up to hundreds of layers.

EXAMPLE 1

Figure 2A:
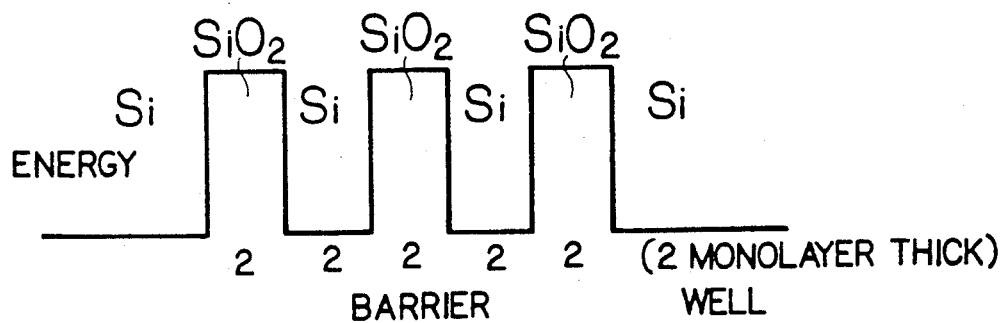
FIG. 2a is a diagrammatical elevational representation of energy versus distance showing the barrier and well regions of a quantum well structure in accordance with this invention.
Figure 2B:
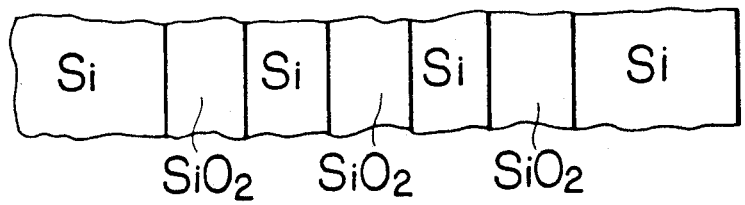

FIG. 2a shows an enlarged section of FIG. 1 in terms of energy and distance, the so-called energy bandedge profile. As shown, the thicknesses of each layer in the barrier region of this example are 2 monoatomic layers The composites of $SiO_2/Si/SiO_2/Si/SiO_2$ serve as barriers. Electrons are then confined by the barriers inside the quantum well of pure silicon with thickness depending on applications, generally in the range of 2-20 nm. FIG. 2b is a schematic of the actual layers.

The following examples describe two typical processes of fabrication.

EXAMPLE 2

Silicon substrate is held at a constant temperature of deposition, in the 600° to 850° C. range. An electron-beam is used for the evaporation of Si and a molecular oxygen beam for oxidation. Since the residual oxygen needs to be pumped out before the next deposition of Si, a fairly large pumping system is required. It is preferable to resume the silicon deposition only after the base pressure of the chamber is again at the desired level in order to have proper control of the epitaxy growth.

EXAMPLE 3

The substrate temperature is kept at 650° C. for the Si deposition and raised to 850° C. for the oxidation cycle.

There might also be a need to incorporate an annealing cycle between each step of layer formation for the alternating layers, and all these procedures described here are well known techniques. Obviously in both cases, shutters and valves are needed to cycle the silicon and oxygen beams.

In this example, the composites of $(SiO_2/Si)n$ serve as energy barriers. Electrons are confined by the barriers inside the quantum well of pure monocrystalline Si of thickness depending on applications.

I claim:

1. A quantum well structure useful for semiconducting devices, said structure comprising two barrier regions and a thin epitaxially grown monocrystalline semiconductor material quantum well sandwiched between said barrier regions, each barrier region consisting essentially of alternate strain layers forming a superlattice, each of said layers being thinner than said quantum well and being so thin that no defects are generated as a result of the release of stored strain energy.

2. A quantum well structure according to claim 1, wherein each of said layers has a thickness of 2 to 4 monolayers.

3. A quantum well structure according to claim 1, wherein the alternate layers are $SiO_2$ and Si in the barrier and the quantum well is Si.

4. A quantum well structure according to claim 2, wherein the alternate layers are $SiO_2$ and Si in the barrier and the quantum well is Si.

5. A quantum well structure according to claim 1, wherein the structure is doped to form desired junction characteristics.

6. A quantum well structure according to claim 1, wherein the layers are one of III-V and II-VI types.

7. A quantum well structure useful for semiconducting devices, said structure comprising two barrier regions and a thin monocrystalline quantum well sandwiched between said barrier regions, the quantum well consisting essentially of alternate strain layers forming a superlattice, each of said layers being so thin that no defects are generated as a result of the release of stored strain energy, each barrier region being thinner than said quantum well and consisting of an epitaxially grown monocrystalline semiconductor material.

8. A quantum well structure useful for semiconducting devices, said structure comprising two barrier regions and a thin epitaxially grown monocrystalline Si quantum well sandwiched between said barrier regions, each barrier region consisting essentially of alternate strain layers of $SiO_2$ and Si forming a superlattice, each of said layers being thinner than said quantum well and being so thin that no defects are generated as a result of the release of stored strain energy.

9. A quantum well structure according to claim 8, wherein each of said layers has a thickness of 2 to 4 monolayers.

10. A quantum well structure according to claim 8, wherein the structure is doped to form desired junction characteristics.

11. A metal oxide-semiconductor field effect transistor, comprising silicon having thereon a metal contact, the metal contact being separated from said silicon by an insulating layer, said insulating layer consisting essentially of alternate strain layers of $SiO_2$ and Si forming a superlattice, each of said layers being so thin that no defects are generated as a result of the release of stored strain energy.

12. A metal oxide-semiconductor field effect transistor according to claim 11, wherein each of said strain layers has a thickness of 2 to 4 monolayers.

13. A metal oxide-semiconductor field effect transistor according to claim 11, additionally having a layer of amorphous $SiO_2$ interposed between said metal contact and said insulating layer of alternate strain layers of $SiO_2$ and Si.

14. A metal oxide-semiconductor field effect transistor according to claim 13, wherein each of said strain layers has a thickness of 2 to 4 monolayers.

15. A metal oxide-semiconductor field effect transistor according to claim 13, wherein the thickness of the layer of amorphous $SiO_2$ is approximately the same as the thickness of said insulating layer of alternate strain layers of $SiO_2$ and Si.

16. A barrier material for use in semiconductor devices including quantum well structures, said material, consisting essentially of alternate strain layers of $SiO_2$ and Si forming a superlattice, each of said layers being so thin that no defects are generated as a result of release of stored strain energy.

17. A barrier material for use in semiconductor devices including quantum well structures according to claim 16, wherein each of said strain layers has a thickness of 2 to 4 monolayers.

* * * * *